(12) United States Patent
Yu

(10) Patent No.: US 6,391,782 B1
(45) Date of Patent: May 21, 2002

(54) PROCESS FOR FORMING MULTIPLE ACTIVE LINES AND GATE-ALL-AROUND MOSFET

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/597,598

(22) Filed: Jun. 20, 2000

(51) Int. Cl.[7] ............................................. H01L 21/311
(52) U.S. Cl. ........................................ 438/696; 438/745
(58) Field of Search .................................. 438/696, 253, 438/255, 745, 158

(56) References Cited

U.S. PATENT DOCUMENTS

| | | |
|---|---|---|
| 5,889,302 A | 3/1999 | Liu |
| 5,936,280 A | 8/1999 | Liu |
| 5,946,566 A * | 8/1999 | Choi ........................... 438/239 |
| 5,989,952 A * | 11/1999 | Jen et al. .................... 438/253 |
| 6,031,264 A | 2/2000 | Chien et al. |

OTHER PUBLICATIONS

Yu, Bin, et al. "Ultra–Thin–Body Silicon–On–Insulator MOSFET's for Terabit–Scale Integration" Department of Electrical Engineering & Computer Sciences, University of California, Berkeley.

Huang, Xuejue, et al. "Sub 50–nm Fin FET: PMOS" Department of Electrical Engineering & Computer Sciences, University of California, Berkeley, 1999 IEEE.

* cited by examiner

Primary Examiner—Richard Elms
Assistant Examiner—Brad Smith
(74) Attorney, Agent, or Firm—Foley & Lardner

(57) ABSTRACT

An ultra-large-scale integrated (ULSI) circuit includes MOSFETs. The MOSFETs can include a gate structure above active lines manufactured by utilizing a spacer structure as a mask. The spacer structure can be silicon dioxide formed in an etch back process. The gate structure can surround more than one side of the active line.

20 Claims, 2 Drawing Sheets

PROCESS FOR FORMING MULTIPLE ACTIVE LINES AND GATE-ALL-AROUND MOSFET

CROSS REFERENCE TO RELATED APPLICATIONS

The present application is related to U.S. Ser. No. 09/5097,598, entitled, "A Process For Forming Gate Conductors", filed by Yu on an even date herewith. The present application is related to U.S. Ser. No. 09/596,993, entitled, "A Hard Mask for Integrated Circuit Fabrication", filed by Yu on an even date herewith. Both applications are assigned to the assignee in the present application.

FIELD OF THE INVENTION

The present invention relates to integrated circuits and methods of manufacturing integrated circuits. More particularly, the present invention relates to a method of manufacturing integrated circuits having transistors with small and/or densely packed and/or multi-sided active lines.

BACKGROUND OF THE INVENTION

Currently, deep-submicron complementary metal oxide semiconductor (CMOS) is the primary technology for ultra-large scale integrated (ULSI) circuits. Over the last two decades, reduction in the size of CMOS transistors has been a principal focus of the microelectronics industry.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. The transistors can be N-channel MOSFETs or P-channel MOSFETs.

Generally, it is desirous to manufacture smaller transistors to increase the component density on an integrated circuit. It is also desirous to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Heretofore, lithographic tools are utilized to form transistors and other structures on the integrated circuit. For example, lithographic tools can be utilized to define gate conductors, active lines conductive lines, vias, doped regions, and other structures associated with an integrated circuit. Most conventional lithographic fabrication processes have only been able to define structures or regions having a dimension of 100 nm or greater.

In one type of conventional lithographic fabrication process, a photoresist mask is coated over a substrate or a layer above the substrate. The photoresist mask is lithographically patterned by providing electromagnetic radiation, such as, ultraviolet light, through an overlay mask. The portions of the photoresist mask exposed to the electromagnetic radiation react (e.g. are cured). The uncured portions of the photoresist mask are removed, thereby transposing and the pattern associated with the overlay to the photoresist mask. The patterned photoresist mask is utilized to etch other mask layers or structures. The etched mask layer and structures, in turn, can be used to define doping regions, other structures, vias, lines, etc.

As the dimensions of structures or features on the integrated circuit reach levels below 100 nm or 50 nm, lithographic techniques are unable to precisely and accurately define the feature. For example, as described above, reduction of the width of the gate conductor (the gate length) associated with a transistor or the of active line associated with an SOI transistor has significant beneficial effects. Future designs of transistors may require that the active line have a width of less than 50 nanometers.

Double gate SOI MOSFETs have received significant attention because of its advantages related to high drive current and high immunity to short channel effects. A double-gate MOSFET structure (FinFet) is discussed in "Sub 50-nm FinFet: PMOS," by Huang et al., 1999 IEDN. In addition, U.S. Pat. No. 5,889,302, issued to the assignee of the present application on Mar. 30, 1999, discusses a quadruple gate field effect transistor on an SOI substrate. The double-gate MOSFET and quadruple-gate MOSFET are able to increase the drive current because the gate surrounds the active region by more than one layer (e.g., the effective gate total width is increased due to the double or quadruple gate structure). However, patterning narrow, dense active regions is challenging. As discussed above with respect to gate conductors, conventional lithographic tools are unable to accurately and precisely define active regions as structures or features with dimensions below 100 nm or 50 nm.

Thus, there is a need for an integrated circuit or electronic device that includes smaller, more densely disposed active regions or active lines. Further still, there is a need for a ULSI circuit which does not utilize conventional lithographic techniques to define active regions or active lines. Even further still, there is a need for a non-lithographic approach for defining active regions or active lines having at least one topographic dimension less than 100 nanometers and less than 50 nanometers (e.g., 20–50 nm). Yet further still, there is a need for an SOI integrated circuit with transistors having multiple sided gate conductors associated with active lines having a width of about 20 to 50 nm.

SUMMARY OF THE INVENTION

An exemplary embodiment relates to a method of manufacturing an integrated circuit. An integrated circuit includes transistors. The transistors include a first transistor having a multi sided gate conductor disposed on at least two sides of an active line. The method includes removing portions of a mask layer above a substrate to form a mask feature, removing portions of an oxide material above the mask feature and the substrate to leave a spacer, removing the mask layer, and etching the substrate in accordance with the spacer. The mask feature has at least one sidewall. The spacer is disposed on the at least one sidewall. The active line is formed by etching the substrate in accordance with the spacer.

Another exemplary embodiment relates to a process of forming a gate conductor. The gate conductor is formed over at least two sides of an active line. The active line has a dimension less than one lithographic feature. The process includes providing a mask layer above a substrate, patterning the mask layer to have a sidewall, and providing an insulative spacer on the sidewall of the mask layer. The method also includes removing the mask layer, etching substrate in accordance with the insulative spacer to form the active line, and providing a conductive layer above the active line to form the gate conductor.

Another exemplary embodiment relates to a method of manufacturing a gate structure on an ultra-large scale integrated circuit. The gate structure covers a number of active lines. The active lines each have at least one dimension less than 50 nanometers. The method includes steps of lithographically patterning a mask layer above a substrate to have a plurality of islands, providing spacers on sidewalls of the islands, removing the islands, removing portions of the substrate in accordance with the spacers to form the active lines, and providing a conductive layer above the active lines as part of the gate structures. The islands have a minimum topographic dimension at least 50 nanometers wide.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
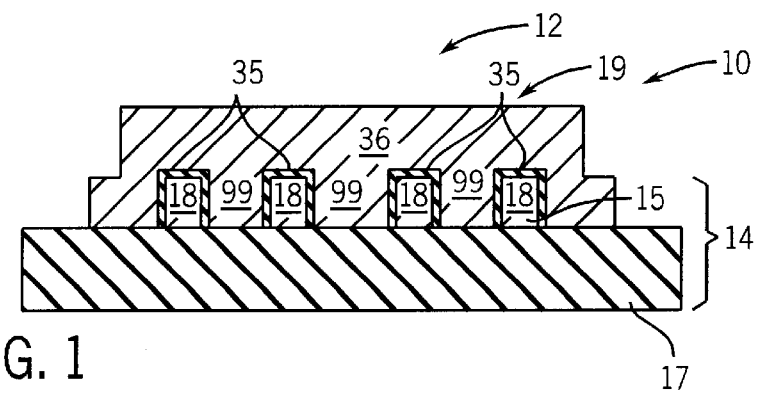
FIG. 1 is a cross-sectional view of a portion of an integrated circuit in accordance with an exemplary embodiment of the present invention, the integrated circuit including a gate structure provided above a number of active lines.

With reference to FIG. 1, a portion 10 of an integrated circuit (IC) includes a number of active lines 18. A gate structure 19 can be formed over active lines 18 to form a transistor 12 with a number (e.g., four) of active lines 18. Transistor 12 can be part of the integrated circuit formed on a semiconductor substrate 14, such as, a wafer.

Semiconductor substrate 14 is preferably a semiconductor-on-insulator (SOI) substrate. Preferably, substrate 14 includes a thin film semiconductor layer 15 and an insulative layer 17. Active lines 18 can be formed from layer 15. A semiconductive base layer can also be included.

Layer 17 is preferably a buried oxide layer, such as, silicon dioxide. Layer 17 can have a thickness of 1000–5000 Å. Layer 15 is preferably a layer of silicon having a thickness of 150–200 Å.

As shown in FIG. 1, transistor 12 associated with active lines 18 can be fully formed or partially formed. Transistor 12 is part of portion 10 of the integrated circuit (IC) manufactured on a wafer (such as, a silicon bulk-type wafer or SOI wafer). Transistor 12 can include a single gate structure 19, source regions, and drain regions. The source and drain regions can be formed in active lines 18 as doped regions. The source and drain as well as structure 19 can be coupled to contacts, conductive vias, interconnects, etc.

Gate structure 19 includes gate oxide structures 35 and a gate conductor 36. Gate oxide structures 35 are preferably thermally grown silicon dioxide to a thickness of 12–20 Å on active lines 18. Alternatively, other materials, such as, silicon nitride ($Si_3N_4$) high K gate dielectrics, or other insulators can be deposited by chemical vapor deposition (CVD) for structures 34.

Gate conductor 36 is preferably blanket deposited as undoped or doped polysilicon by chemical vapor deposition (CVD) and etched to form the particular structure for transistor 12. Preferably, conductor 36 is provided between active lines 18 to form a multi-sided (e.g., three sided) gate for each of active lines 18. Gate conductors 36 can traverse substrate 14 in accordance with various circuit designs. Alternatively, conductors 36 can include metal, such as, titanium nitride (TiN), Molybdenum (MO), Tungsten (W), or other conductor. Gate conductors 36 and structure 19 preferably have a height or thickness of 1500–2000 Å.

Gate conductor 36 of gate structure 19 can be divided into separate gate conductors. For example, isolation structures can be formed between neighboring active lines 18 if isolated transistor performance is necessary. Otherwise, transistor 12 operates as a single transistor with four active lines 18. In other embodiments, more or fewer active lines 18 can be utilized. Advantageously, higher drive current is obtained because conductor 36 surrounds at least two sides of each active line 18. Active lines 18 can have a thickness less than 200 Å which reduces the susceptibility of transistor 12 to short channel affects such as voltage roll-off and drain-induced barrier lowering.

Gate structure 19 including gate conductor 36 and structures 34 advantageously have a width (e.g., from left to right) of 100–600 nm. However, each active line 18 advantageously has a width of less than 20–50 nm. An advantageous process forms conductive lines 18 without the direct use of photolithography. Preferably, active lines 18 are spaced from 100–600 nm from each other. The reduced width associated with gate structures 18 allows multiple, densely packed lines 18 to be formed on substrate 14.

Active lines 18 can be for transistors which are N-channel or P-channel field effect transistors, such as, a metal oxide semiconductor field effect transistors (MOSFETs). Transistor 12 can be at least partially covered by an insulative layer and is preferably part of an ultra-large scale integrated (ULSI) circuit that includes one million or more transistors.

With reference to FIGS. 1–8, the fabrication of active lines 18 is described below as follows. As discussed above with reference to FIG. 1, active lines 18 can be formed which have at least one dimension (topographic) less than conventional lithographic capabilities (less than 100 nm).

Figure 2:
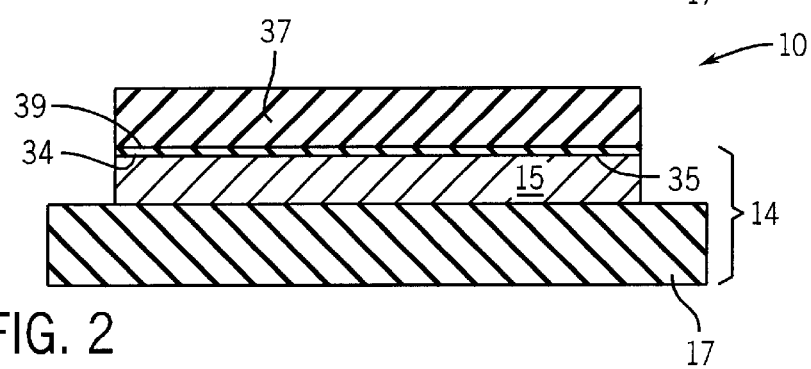
FIG. 2 is a cross-sectional view of the portion of the integrated circuit illustrated in FIG. 1, showing a liner oxide formation step and a mask deposition step.

In FIG. 2, an oxide liner layer 24 is deposited or thermally grown over a top surface 35 of layer 15. Layer 24 is preferably thermally grown as silicon dioxide to a thickness of 100–200 Å. Layer 15 is preferably a thin film of single crystal silicon material associated with substrate 14. Layer 15 is 300–800 Å thick.

A layer 37 is deposited on a top surface 39 of layer 24. Preferably, layer 37 is provided as a cap layer, such as, a silicon nitride ($Si_3N_4$) cap layer. Layer 37 is deposited by CVD and has a thickness of 800–1500 Å (most preferably, 1000–1500 Å). Layer 37 serves as an anti-reflective coating for superior lithographic capabilities as well as a sacrificial (dummy) mask layer. Alternatively, other nitride layers or mask materials can be utilized as layer 37.

Figure 3:
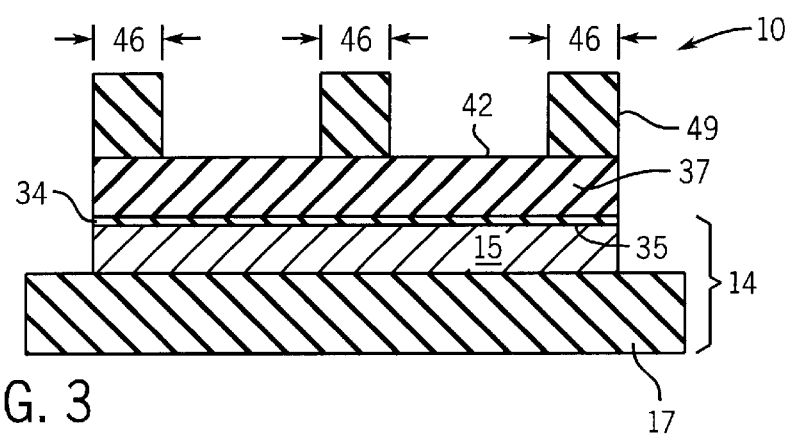
FIG. 3 is a cross-sectional view of the portion of the integrated circuit illustrated in FIG. 2, showing a lithographic step.

In FIG. 3, a photoresist layer 49 is applied above a top surface 42 of layer 37. Photoresist layer 49 is lithographically configured in accordance with a conventional tool to form a pattern including photoresist structures 44. Various photolithographic processes and materials can be utilized to leave structures 44 on top surface 42 of layer 43. Dimensions 46 associated with structures 44 are larger than the widths of active lines 18 (FIG. 1).

Figure 4:
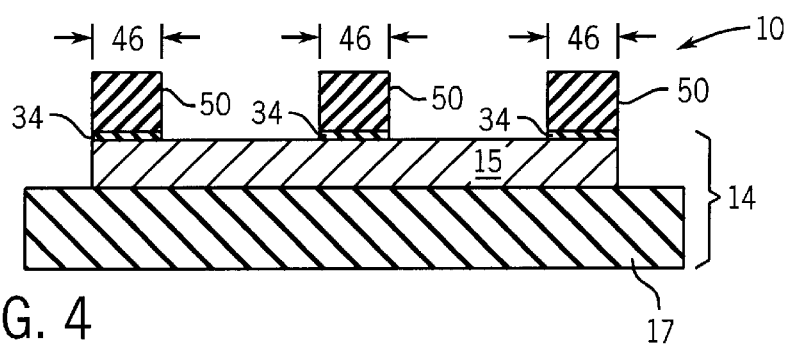
FIG. 4 is a cross-sectional view of the portion of the integrated circuit illustrated in FIG. 3, showing a mask etching step.

In FIG. 4, after structures 44 are formed, layers 37 and 34 are etched in accordance with photoresist structures 44 to leave mask features or islands 50 associated with layer 43. Islands 50 have a width corresponding to dimension 46 (100–500 nm) (FIG. 3) and are spaced from each other by 100 to 600 nm. Islands 50 preferably have a width of at least one lithographic feature. The width of one lithographic feature can be affected by the type of lithographic equipment, the wavelength of the light from such equipment, and other lithographic factors.

Figure 5:
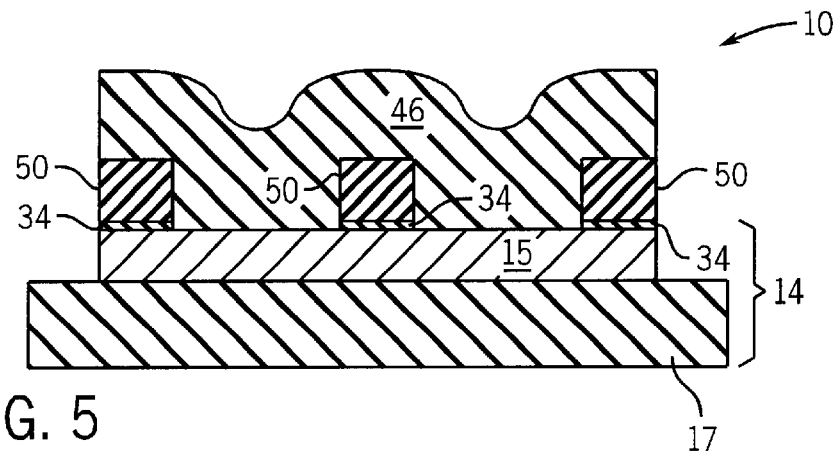
FIG. 5 is a cross-sectional view of the portion of the integrated circuit illustrated in FIG. 4, showing an insulative layer deposition step.

In FIG. 5, islands 50 and layer 15 are covered by an insulative layer 46. Preferably, insulative layer 46 is a TEOS blanket deposited silicon dioxide layer. Insulative layer 46 is preferably thicker than islands 50 (e.g., 3000–5000 Å thick).

Figure 6:
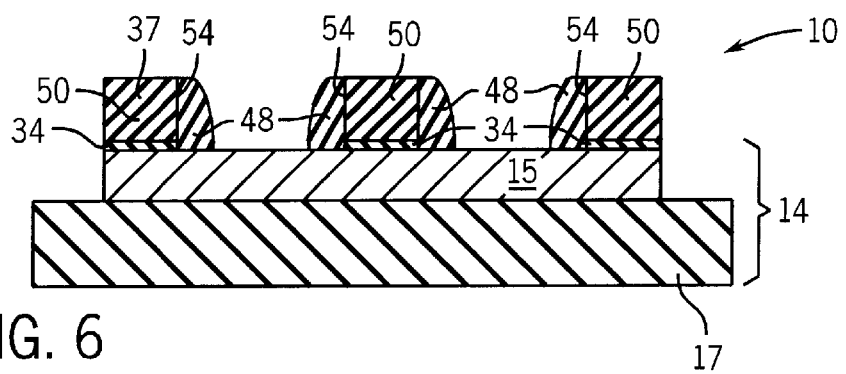
FIG. 6 is a cross-sectional view of the portion of the integrated circuit illustrated in FIG. 5, showing a spacer formation step.

In FIG. 6, portions of insulating layer 46 are etched to leave spacers 48 on sidewalls 54 of islands 50. Spacers 48 abut sidewalls 54 of islands 50 and are narrower than islands 50. Preferably, layer 46 utilizes a conventional anisotropic dry etch back process to leave spacers 48. The width of spacers 48 is preferably controlled to be less than 100 nm, preferably between 20–50 nm.

Figure 7:
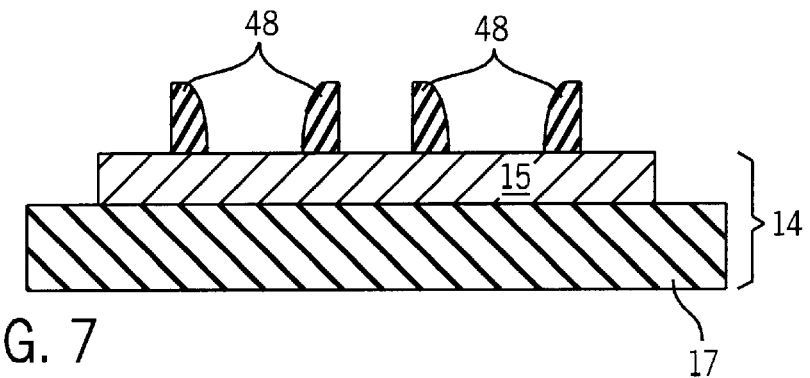
FIG. 7 is a cross-sectional view of the portion of the integrated circuit illustrated in FIG. 6, showing a mask removal step.

In FIG. 7, after spacers 48 are formed, islands 50 are removed in a wet chemical etching process. In addition, portions of layer 34 underneath islands 50 are removed. Alternatively, other removal processes can be utilized to remove islands 50 and layer 34. Thus, layer 37 (islands 50) can serve as a sacrificial (dummy) film for forming oxide hard masks (e.g., spacers 48).

Figure 8:
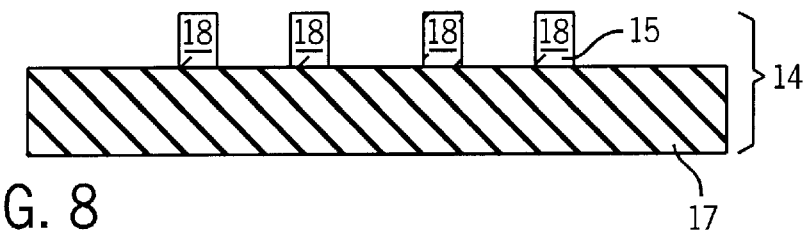
FIG. 8 is a cross-sectional view of the portion of the integrated circuit illustrated in FIG. 7, showing a substrate etching step.

In FIG. 8, layer 15 is etched in accords with spacers 48 to leave active lines 18. Layer 15 can be etched in a dry etching or a wet etching process. Preferably, a dry etching process selective to silicon is utilized to etch layer 15. Thus, spacers 48 act as an oxide hard mask for forming structures 18. The width (from left to right) of active lines 18 is preferably similar to the width of spacers 48 (e.g., less than 100 nm, preferably 20–50 nm). The width of spacers can be 0.04 to 0.5 the width of islands 50. Generally, gate structures 18 are between 100–500 nm apart (e.g., the width of islands 50). Thus, densely packed active lines 48 are formed on substrate 14 according to an oxide hard mask process which does not directly rely on conventional photolithographic etching process.

After layer 15 is etched to form lines 15, spacers 48 are removed by a dry etching process selective to silicon dioxide. After active lines 18 are formed, gate oxide structures 34 are grown on at least two sides (preferably three sides) of active lines 18. Gate oxide structures 35 are preferably 12–20 Å thick thermally grown silicon dioxide layers. After the formation of structures 35, a conductive material for gate conductor 36 is blanket deposited above structures 35. Preferably, a 3000 to 5000 Å layer of polysilicon is deposited by CVD. The layer is deposited in a doped or an undoped form. Gate conductor 36 preferably is disposed within spaces 99 between active lines 18, thereby assuring that at least two sides of each active line is covered by gate conductor 36. Conventional SOI MOS fabrication processing can be utilized to complete transistor, contacts, interconnects and interlevel dielectrics for portion 10.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although SOI substrates are shown, other substrates can be utilized. Various changes may be made to the details disclosed without departing from the spirit of the invention which is defined by the following claims.

What is claimed is:

1. A method of manufacturing an integrated circuit including a plurality of transistors, the plurality of transistors including a first transistor having a multi-sided gate conductor disposed on at least two sides of an active line, the method comprising:

removing portions of a mask layer above a substrate to form a mask feature, the mask feature having at least one sidewall;

removing portions of an oxide material above the mask feature and the substrate to leave a spacer on the at least one sidewall;

removing the mask layer; and etching the substrate in accordance with the spacer, thereby forming the active line, wherein the active line has a width between 20 nm and 50 nm.

2. The method of claim 1, wherein the substrate is part of a silicon-on-insulator substrate.

3. The method of claim 2, further comprising providing a thin dielectric layer over at least two sides of the active line.

4. The method of claim 3, further comprising providing a conductive layer over at least two sides of the dielectric layer.

5. A method of manufacturing an integrated circuit including a plurality of transistors, the plurality of transistors including a first transistor having a multi-sided gate conductor disposed on at least two sides of an active line, the method comprising:

removing portions of a mask layer above a substrate to form a mask feature, the mask feature having at least one sidewall;

removing portions of an oxide material above the mask feature and the substrate to leave a spacer on the at least one sidewall;

removing the mask layer; and etching the substrate in accordance with the spacer, thereby forming the active line, wherein the substrate is part of a silicon-on-insulator substrate.

6. The method of claim 5, wherein the spacer is 0.1 to 0.5 times as wide as the mask feature.

7. A process of forming a gate conductor over at least two sides of an active line, the active line having a dimension less than one lithographic feature, the process comprising:

providing a mask layer above a substrate;

patterning the mask layer to have a sidewall;

providing an insulative spacer as a mask feature on the sidewall of the mask layer;

removing the mask layer;

etching the substrate in accordance with the insulative spacer as the mask feature to form the active line; and providing a conductive layer above the active line to form the gate conductor wherein the insulative spacer is 20–50 nm wide.

8. The process of claim 7, wherein the gate conductor includes polysilicon.

9. The process of claim 8, wherein the mask layer includes nitride.

10. The process of claim 7, wherein a plurality of active lines are formed.

11. The process of claim 7, wherein a gate oxide layer is below the conductive layer.

12. The process of claim 7, wherein the substrate is part of a silicon-on-insulator substrate.

13. The process of claim 7, wherein the insulative spacer is TEOS deposited silicon dioxide.

14. A method of manufacturing a gate structure on an ultra-large scale integrated circuit, the gate structure covering a plurality of active lines, the active lines each having at least one dimension less than 50 nm, the method comprising steps of:

lithographically patterning a mask layer above a substrate to have a plurality of islands, the islands having a minimum topographic dimension at least 50 nm wide;

providing spacers on sidewalls of the islands;

removing the islands;

removing portions of the substrate in accordance with the spacers to form the active lines; and providing a conductive layer above the active lines as part of the gate structure, wherein the spacers are 20–50 nm wide.

15. The method of claim 14, wherein the islands are spaced from each other at least 100 nm.

16. The method of claim 15, wherein the islands are between 100–500 nm wide.

17. The method of claim 16, wherein the substrate is a silicon-on-insulator substrate.

18. The method of claim 14, further providing the spacers step is a deposition and etch back step.

19. A method of manufacturing a gate structure on an ultra-large scale integrated circuit, the gate structure covering a plurality of active lines, the active lines each having at least one dimension less than 50 nm, the method comprising steps of:

lithographically patterning a mask layer above a substrate to have a plurality of islands, the islands having a minimum topographic dimension at least 50 nm wide;

providing spacers on sidewalls of the islands;

removing the islands;

removing portions of the substrate in accordance with the spacers to form the active lines; and providing a conductive layer above the active lines as part of the gate structure, wherein the spacers include TEOS deposited silicon dioxide.

20. The method of claim 14, wherein the active lines are surrounded by an insulative material.

* * * * *